US008947131B2

(12) United States Patent
Lee

(10) Patent No.: US 8,947,131 B2
(45) Date of Patent: Feb. 3, 2015

(54) MULTI-VOLTAGE SUPPLIED INPUT BUFFER

(71) Applicant: Samsung Electronics Co., Ltd., Suwon-si (KR)

(72) Inventor: Seungho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/031,296

(22) Filed: Sep. 19, 2013

(65) Prior Publication Data

US 2014/0097888 A1    Apr. 10, 2014

(30) Foreign Application Priority Data

Oct. 4, 2012 (KR) ........................ 10-2012-0110119

(51) Int. Cl.
*H03K 3/00* (2006.01)
*H02M 3/155* (2006.01)

(52) U.S. Cl.
CPC .................................... *H02M 3/155* (2013.01)
USPC ............................................ 327/108; 326/83

(58) Field of Classification Search
CPC .............. H03K 17/08; H03K 17/0812; H03K 19/0185; H03K 19/018507; H03K 19/018521; H03K 19/094–19/0941; H03K 19/0944; H03K 19/09441; H03K 19/0948
See application file for complete search history.

(56) References Cited

U.S. PATENT DOCUMENTS

| | | | | |
|---|---|---|---|---|
| 5,124,574 A | * | 6/1992 | Ibaraki | 327/566 |
| 5,565,795 A | * | 10/1996 | Kawano | 326/81 |
| 5,804,998 A | * | 9/1998 | Cahill et al. | 327/108 |
| 6,018,257 A | * | 1/2000 | Hung et al. | 327/112 |
| 6,346,829 B1 | * | 2/2002 | Coddington | 326/81 |
| 6,359,471 B1 | * | 3/2002 | Mueller et al. | 326/81 |
| 6,441,643 B1 | * | 8/2002 | Chan et al. | 326/81 |
| 6,724,226 B2 | | 4/2004 | Kim | |
| 6,856,168 B2 | | 2/2005 | Oertle et al. | |
| 7,193,441 B2 | * | 3/2007 | Chen et al. | 326/81 |
| 7,224,186 B2 | * | 5/2007 | Tsukada | 326/83 |
| 7,283,342 B1 | | 10/2007 | Ker et al. | |
| 7,495,483 B2 | | 2/2009 | Kumar et al. | |
| 7,521,970 B2 | | 4/2009 | Gupta et al. | |
| 7,642,818 B1 | | 1/2010 | Koike | |
| 7,746,124 B2 | * | 6/2010 | Ajit | 327/108 |
| 7,830,174 B2 | | 11/2010 | Uno | |

(Continued)

FOREIGN PATENT DOCUMENTS

| | | |
|---|---|---|
| JP | 2010-124275 | 6/2010 |
| KR | 10-2003-0002501 A | 1/2003 |

(Continued)

*Primary Examiner* — Thomas J Hiltunen
(74) *Attorney, Agent, or Firm* — Myers Bigel Sibley & Sajovec, P.A.

(57) ABSTRACT

An input buffer capable of interfacing higher-voltage logic signals to lower voltage internal circuitry includes a first stage configured to generate a first output signal in response to an input signal, the first stage configured to receive a first power supply voltage and including semiconductor circuit components configured to be variably biased responsive to a variable voltage. The input buffer also includes a second stage configured to receive the first output voltage and to responsively generate a second output signal, the second stage biased according to the first power supply voltage. The input buffer further includes a bias circuit configured to generate the variable voltage responsive to a state of the input signal.

20 Claims, 10 Drawing Sheets

(56) References Cited

U.S. PATENT DOCUMENTS

| | | |
|---|---|---|
| 8,395,433 B2 * | 3/2013 | Rien et al. ................ 327/313 |
| 8,629,704 B2 * | 1/2014 | Yang et al. ................ 327/333 |
| 2008/0001628 A1 * | 1/2008 | Nagata ........................ 326/63 |
| 2009/0224821 A1 | 9/2009 | Ajit |
| 2010/0141324 A1 | 6/2010 | Wang et al. |
| 2011/0043249 A1 | 2/2011 | Harris et al. |

FOREIGN PATENT DOCUMENTS

| | | |
|---|---|---|
| KR | 10-2008-0013759 A | 2/2008 |
| WO | WO 2009/120200 A1 | 10/2009 |

* cited by examiner

| Vo | 1.8 | 2.5 | 3.3 |
| --- | --- | --- | --- |
| Vo1 | 0 | 0.6 | 1.4 |
| Vo2 | 1 | 0 | 0 |
| Vo3 | 0 | 1 | 0 |

MULTI-VOLTAGE SUPPLIED INPUT BUFFER

CROSS-REFERENCE TO RELATED APPLICATIONS

A claim for priority under 35 U.S.C. §119 is made to Korean Patent Application No. 10-2012-0110119 filed Oct. 4, 2012, in the Korean Intellectual Property Office, the entire contents of which are hereby incorporated by reference.

BACKGROUND

The inventive subject matter described herein relates to integrated circuit devices and, more particularly, to input buffers.

An input buffer may be used to receive data provided to an integrated circuit from an external system. The input buffer may protect semiconductor devices in the integrated circuit from high voltage. The input buffer may have tolerance against a noise included in an input through a series of inverter stages or a Schmitt trigger.

As a degree of integration of integrated circuits increases, low-voltage semiconductor devices, such as medium-gate oxide semiconductor devices, may be preferred for use in integrated circuits. Medium-gate oxide semiconductor devices may consume less power and operate at high speed. However, medium-gate oxide semiconductor devices may be driven with a low voltage. If a voltage difference between nodes of a medium-gate oxide semiconductor device exceeds a prescribed voltage, the lifetime and stability of the device may be reduced by gate oxide breakdown or punch through. An input/output interface of the integrated circuit may support a relatively high voltage input signal for compatibility of the integrated circuit with external devices. Accordingly, there may be a need for techniques for interfacing such a high voltage input signal to a low voltage semiconductor device.

SUMMARY

According to some embodiments of the inventive subject matter, an input buffer includes a first stage configured to generate a first output signal in response to an input signal, the first stage configured to receive a first power supply voltage and including semiconductor circuit components configured to be variably biased responsive to a variable voltage. The input buffer also includes a second stage configured to receive the first output voltage and to responsively generate a second output signal, the second stage biased according to the first power supply voltage. The input buffer further includes a bias circuit configured to generate the variable voltage responsive to a state of the input signal. The second stage may be configured to receive input signals having a first maximum voltage and the first stage may be configured to receive input signals having a second maximum voltage greater than the first maximum voltage.

In some embodiments, the semiconductor circuit components may include field-effect transistors having wells configured to be variably biased responsive to the variable voltage. According to some embodiments, the bias circuit may be configured to generate the variable voltage in proportion to a voltage of a logic high state of the input signal.

In further embodiments, the first stage may include a pull-up circuit coupled to an output node of the first stage and configured to pull up the output node to the variable voltage. The first stage may include a pull-up control circuit configured to limit a voltage applied to an input of the pull-up circuit responsive to the variable voltage.

One aspect of embodiments of the inventive subject matter is directed to provide an input buffer including a first stage which is formed of semiconductor circuit elements for a first power supply voltage, receives a variable voltage higher than the first power supply voltage as an operating voltage, and generates a first output signal in response to an input signal; and a second stage which is formed of a semiconductor circuit element for the first power supply voltage, receives the first power supply voltage as an operating voltage, and generates a second output signal as an input buffering output in response to the first output signal, wherein the variable voltage has one selected from a plurality of levels according to a level of a first state voltage of the input signal.

In example embodiments, a first state of the input signal is a logic high state and the variable voltage has a higher level in proportion to an increase in a level of the first state voltage of the input signal.

In example embodiments, the first stage includes a pull-up unit which generates a pull-up output signal in response to a pull-up input signal; a pull-down unit which generates a pull-down output signal in response to the input signal; an output unit which generates a first output signal in response to the pull-up and pull-down output signals; and a first pull-up protection unit which provides the pull-up input signal to the pull-up unit in response to the input signal, wherein when the input signal is at a logic low state, the first pull-up protection unit provides the pull-up unit with a pull-up bias voltage, as the pull-up input signal, varied in response to a level of the variable voltage.

In example embodiments, the pull-up unit generates the variable voltage as the pull-up output signal when the pull-up bias voltage is provided as the pull-up input signal.

In example embodiments, the first stage further includes a first bias circuit which generates the pull-up bias voltage; and wherein the first bias circuit includes a first switch which provides the first power supply voltage as the pull-up bias voltage in response to a first control signal; and a second switch which provides a ground voltage as the pull-up bias voltage in response to a second control signal, the first and second control signals being selectively activated according to a level of the variable voltage.

In example embodiments, if a logic high state voltage of the input signal is the first power supply voltage, the first pull-up protection unit provides the pull-up unit the input signal as a pull-up input signal instead of the pull-up bias voltage when the input signal is at a logic low state.

In example embodiments, the input buffer further includes a second pull-up protection unit which is connected with an output terminal of the pull-up unit. The pull-down unit generates a ground voltage as a pull-down output signal when the input signal is at a logic high state, and the second pull-up protection unit is turned on when the first output signal has a ground voltage, such that a voltage of the output terminal of the pull-up unit increases.

In example embodiments, the input buffer further includes a pull-down protection unit which is connected with an input terminal of the pull-down unit. The pull-down protection unit limits a level of the input signal to a predetermined level when the input signal is at a logic high state.

In example embodiments, the second stage includes a low threshold voltage modulating unit which is connected with the pull-up unit and modulates a low threshold voltage of the input buffers; and a high threshold voltage modulating unit which is connected with the pull-down unit and modulates a high threshold voltage of the input buffers, the low threshold voltage modulating unit being activated when a logic high state level of the input signal is a level of the first power supply voltage.

One aspect of embodiments of the inventive subject matter is directed to provide an input buffer including an pull-up unit which is formed of a semiconductor circuit element for a first power supply voltage, receives a variable voltage higher than the first power supply voltage as an operating voltage, and generates a pull-up output signal in response to a pull-up input signal; a pull-down unit which is formed of a semiconductor circuit element for the first power supply voltage and generates a pull-down output signal in response to an input signal; an output unit which generates a first output signal in response to the pull-up and pull-down output signals; a pull-up control unit which generates the pull-up control signal in response to the input signal; and a pull-up protection unit which provides a pull-up input signal to the pull-up unit in response to the pull-up control signal. The pull-up protection unit includes a first pull-up protection transistor having a source connected to receive a pull-up bias voltage, a gate connected to receive a pull-up control signal, and a drain connected to output the pull-up bias voltage; and a second pull-up protection transistor having a drain connected with the drain of the first pull-up protection transistor, a gate connected to receive the pull-up bias voltage, and a source connected to output the pull-up input signal. The pull-up unit includes a pull-up transistor having a source connected to receive a variable voltage, a gate connected to receive the pull-up input signal, and a drain connected to output the pull-up output signal. The variable voltage has one selected from a plurality of levels according to a level of a first state voltage of the input signal.

In example embodiments, the pull-up control unit includes a first discharge transistor having a source connected to receive a ground voltage, a gate connected to receive a discharge signal, and a drain; and a second discharge transistor having a drain connected with the gate of the first pull-up protection unit, a source connected with the drain of the first discharge transistor, and a gate connected to receive the first power supply voltage, the discharge signal being an inverted version of the input signal.

In example embodiments, the pull-up control unit further includes a third pull-up protection transistor having a gate connected with the drain of the first discharge transistor, a drain connected with the drain of the second discharge transistor, and a source connected with the gate of the pull-up transistor.

In example embodiments, the pull-up control unit includes NMOS transistors connected in series, one end of the NMOS transistors is connected to receive the input signal, the other end of the NMOS transistors is connected with the gate of the pull-up transistor, and gates of the NMOS transistors are controlled such that the NMOS transistor are all turned on when a logic high state voltage of the input signal is the first power supply voltage and the input signal is at a logic low state.

In example embodiments, the pull-down unit includes a pull-down control transistor having a drain connected to receive the input signal, a gate connected to receive the first power supply voltage, and a source connected to output the pull-down control signal; and a pull-down transistor having a source connected to receive a ground voltage, a gate connected to receive the pull-down control signal, and a drain connected to output the pull-down output signal.

In example embodiments, the pull-down unit further includes a pull-down protection transistor having a source connected with the drain of the pull-down transistor, a gate connected to receive the first power supply voltage, and a drain connected to output the pull-down output signal.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
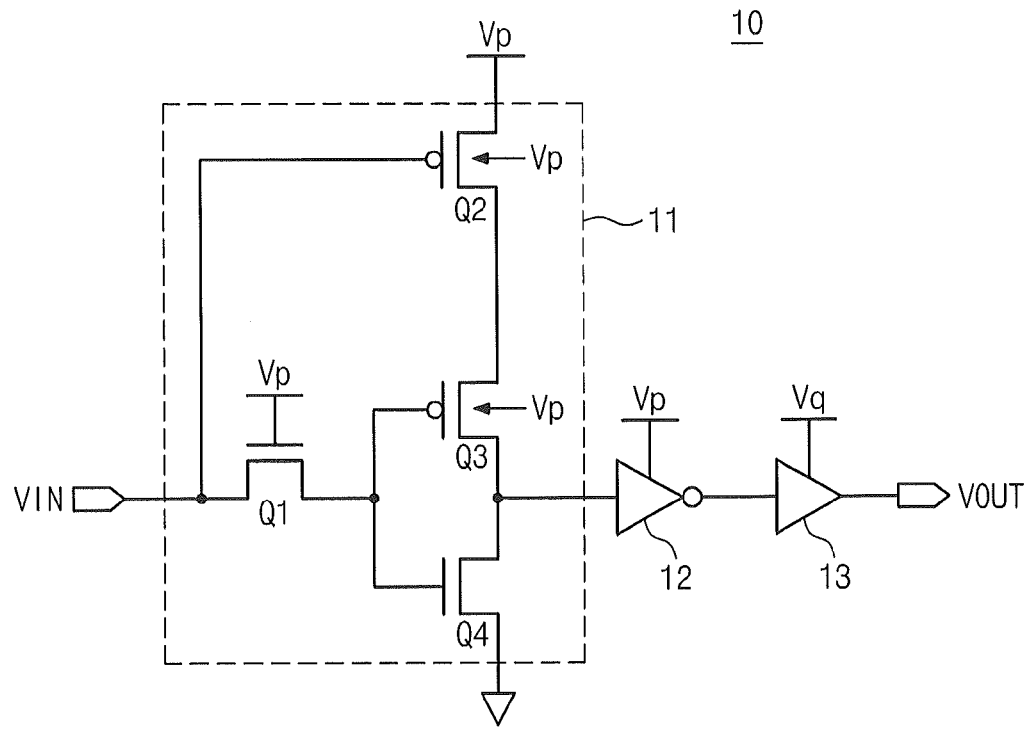
FIG. 1 is a circuit diagram schematically illustrating an input buffer.

Embodiments will be described in detail with reference to the accompanying drawings. The inventive subject matter, however, may be embodied in various different forms, and should not be construed as being limited only to the illustrated embodiments. Rather, these embodiments are provided as examples so that this disclosure will be thorough and complete, and will fully convey the concept of the inventive subject matter to those skilled in the art. Accordingly, known processes, elements, and techniques are not described with respect to some of the embodiments of the inventive subject matter. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive subject matter.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the present application, a high voltage input signal may mean an input signal having a voltage (e.g., 3.3V) higher than a core voltage Vq and a low power supply voltage Vp at a logic high state. A low voltage input signal may mean an input signal having the low power supply voltage Vp (e.g., 1.8V) at a logic low state.

A low voltage semiconductor device may mean a semiconductor device that is driven at the low power supply voltage Vp. As described above, the low power supply voltage Vp may have a voltage level lower than that of the high voltage input signal at a logic high state. For example, a low voltage semiconductor device may be a medium-gate oxide semiconductor device.

A low voltage semiconductor device may have a limiting voltage. If a voltage difference between nodes of the low voltage semiconductor device exceeds the limiting voltage, the low voltage semiconductor device may be broken down or operate abnormally.

FIG. 1 is a circuit diagram schematically illustrating an input buffer. Referring to FIG. 1, an input buffer 10 may include an inverting unit 11, a first buffer unit 12, and a second buffer unit 13. The inverting unit 11 may include PMOS transistors Q2 and Q3 and NMOS transistors Q1 and Q4. The transistors Q1 to Q4 included in the inverting unit 11 may be low voltage semiconductor devices.

A bias voltage supplied to the input buffer 10 may include a variable voltage Vo, a low power supply voltage Vp, and a core voltage Vq. The low power supply voltage Vp may be a power supply voltage having a voltage level lower than a limiting voltage of the transistors Q1 to Q4. In example embodiments, the low power supply voltage Vp is about 1.8V.

The variable voltage Vo may be an I/O voltage provided to the input buffer 10. The variable voltage Vo may selectively have various voltage levels ranging from a low voltage level to a high voltage level. For example, the variable voltage Vo may be set to Vp, 1.5Vp, or 2Vp. In example embodiments, the variable voltage Vo is 1.8V, 2.5V, or 3.3V. However, embodiments of the inventive subject matter are not limited thereto. The variable voltage Vo may be adjusted according to the specification of the input buffer 10.

The core voltage Vq may be a core voltage of an electronic device that is to be connected to the input buffer 10. The core voltage Vq may be a required operating voltage.

The low power supply voltage Vp may be supplied to the transistors Q1 to Q4 and the first buffer unit 12 of the input buffer 10. Below, biasing and operating of the input buffer 10 will be described.

An input signal VIN may be applied to an input pad. An output signal VOUT may be generated from an input pad connected to the second buffer unit 13. The input signal VIN may be applied to a gate of the transistor Q2 and a drain of the transistor Q1.

If the input signal VIN is at a logic low state, the transistors Q2 and Q3 may be turned on. An output of the inverting unit 11 may go to a logic high state having a Vp level. Since the low power supply voltage Vp has a voltage level lower than the limiting voltage of the transistors Q1 and Q4, the transistors Q1 to Q4 may be stably driven without breakdown.

If the input signal VIN is at a logic high state, the transistor Q4 may be turned on. An output of the inverting unit 11 may go to a logic low state. Although the input signal VIN has a voltage level higher than the limiting voltage of the transistors Q1 to Q4, a voltage lower than the low power supply voltage Vp may be applied to a gate of the transistor Q4 by the transistor Q1. Thus, even in the case that the input signal VIN is at a logic high state, the transistors Q1 to Q4 may be stably driven without breakdown.

The input buffer 10 may satisfy a specification for reliable operation. Below, such a specification for the input buffer 10 will be more fully described with reference to FIG. 2.

Figure 2:
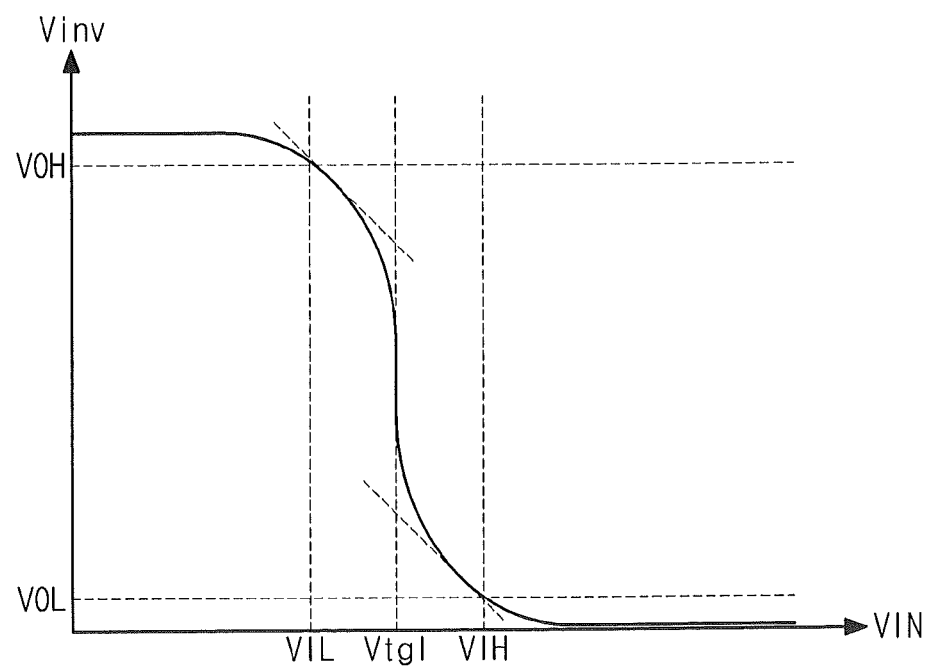
FIG. 2 is a graph illustrating an input/output voltage characteristic of an inverting unit of the input buffer of FIG. 1.

FIG. 2 is a graph illustrating an input/output voltage characteristic of an inverting unit 11 of FIG. 1. In FIG. 2, a horizontal axis indicates an input signal VIN, and a vertical axis indicates a voltage Vinv of the inverting unit 11.

Referring to FIG. 2, an inverting unit 11 of an input buffer 10 may have a minimum logic high input voltage (hereinafter, referred to as "VIH") and a maximum logic low input voltage (hereinafter, referred to as "VIL"). The VIH may be a minimum input signal level securing a logic low state of an output of the inverting unit 11. The VIL may be a maximum input signal level securing a logic high state of the output of the inverting unit 11. As illustrated in FIG. 2, the VIH and VIL may be designated to be an input signal level at a point where a slope of an input/output graph is −1. If a voltage level of an input signal exists between VIH and VIL, the output of the inverting unit 11 may have an uncertain value.

The inverting unit 11 may have a minimum logic high output voltage (hereinafter, referred to as "VOH") and a maximum logic low output voltage (hereinafter, referred to as "VOL"). VOH may be a minimum voltage level when the output of the inverting unit 11 is at a logic high state. The output Vinv may go to the VOH when the input signal VIN is at the VIL. On the other hand, the output Vinv may go to the VOL when the output of the inverting unit 11 is at a logic low state. The output Vinv may go to the VOL when the input signal VIN is at the VIH. The VOH may be higher than the VOL. The VOL may be lower than the VIL.

The inverting unit 11 may have a toggle voltage Vtg1. The toggle voltage Vtg1 may also be referred to as a switching point. The toggle voltage Vtg1 may be an input voltage when an output voltage level of the inverting unit 11 is half the logic high state output level.

To drive the input buffer 10 normally, the inverting unit 11 may satisfy the following condition:

$$VIL < Vtg1 < VIH \qquad (1).$$

Returning to FIG. 1, when an input signal of the input buffer 10 is a high voltage input signal, it may be difficult for the inverting unit 11 of the input buffer 10 to satisfy the above-described condition.

It is assumed that a voltage VD, for example, 3.3V, is applied when the high voltage input signal is at a logic high state. In view of a noise included in an input signal, the VIH and the VIL may satisfy voltage levels 0.7VD and 0.3VD, respectively.

Referring to equation 1, a toggle voltage Vtg1 of the inverting unit 11 may be between the VIH and the VIL. However, since a driving voltage of the inverting unit 11 is the low power supply voltage Vp, in a typical case, the toggle voltage of the inverting unit 11 may be Vp/2. That is, the toggle voltage Vtg1 may be lower than a required VIL. In the case that the toggle voltage Vtg1 is out of a range between the VIH and the VIL, the reliability of the input buffer 10 may be reduced, and the input buffer 10 may be prone to a noise.

To put the toggle voltage Vtg1 between the VIH and the VIL, aspect ratios of transistors Q2, Q3, and Q4 may be controlled. However, if an aspect ratio of the transistor Q4 is changed to set the toggle voltage Vtg1, an operating speed of the transistors Q2 and Q3 may be different from an operating speed of the transistor Q4. In this case, a switching time of the inverting unit 11 may be significantly limited.

Some embodiments of the inventive subject matter may provide an input buffer that uses a variable voltage Vo as a driving voltage to satisfy a specification of the inverting unit 11 when a high voltage input signal is used as an input signal of the input buffer 10. Some embodiments of the inventive subject matter may provide an input buffer which is capable of solving a problem, associated with the stability of internal elements of the input buffer that may occur when the variable voltage Vo is used as a driving voltage.

Figure 3:
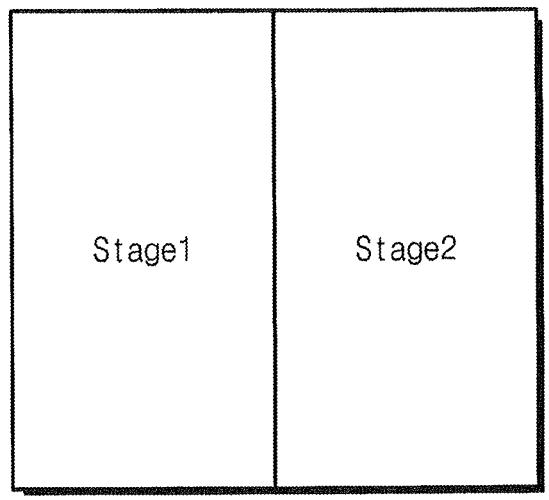
FIG. 3 is a block diagram schematically illustrating an input buffer according to some embodiments of the inventive subject matter.

FIG. 3 is a block diagram schematically illustrating an input buffer 100 according to some embodiments of the inventive subject matter. The input buffer 100 may include two stages. A first stage may be a circuit that is added to secure the stability of internal elements and to satisfy the above-described condition. The second stage may be an input buffer circuit such as that illustrated in FIG. 1.

The input buffer 100 in FIG. 3 may use a variable voltage Vo, a low power supply voltage Vp, and a core voltage Vq as a driving voltage. The variable voltage Vo may be controlled to have one of a plurality of predetermined voltage levels. A voltage level of the variable voltage Vo may be decided according to a logic high state level of an input signal VIN. In example embodiments, the variable voltage Vo may be set to have a voltage level between Vp and 2Vp.

The low power supply voltage Vp may be set to 1.8V. The variable voltage Vo may be set to have one of 1.8V, 2.5V and 3.3V in response to a logic high state level of the input signal VIN. However, the inventive subject matter is not limited thereto.

The input buffer 100 may satisfy a specification by using the variable voltage Vo having a high level as a driving voltage when a high voltage input signal is received. The input buffer 100 may include auxiliary circuit blocks to secure the stability and lifetime of internal elements although the variable voltage Vo having a high level is used as a driving voltage. The input buffers 100 will be more fully described with reference to FIGS. 4A to 4C.

Figures 4A, 4B:
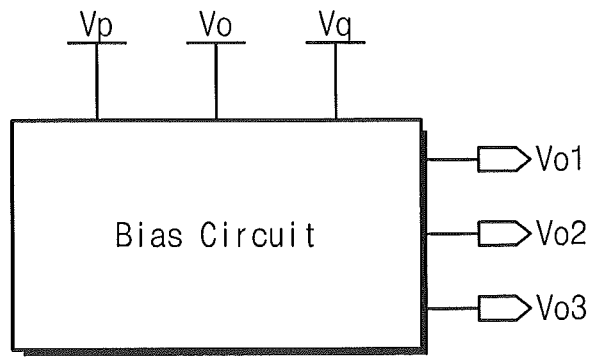
FIG. 4A is a diagram illustrating a main bias circuit providing a driving voltage to the input buffer of FIG. 3.
FIG. 4B is a table illustrating levels of auxiliary voltages according to a level of a variable voltage Vo.

FIG. 4A is a diagram illustrating a main bias circuit providing a driving voltage to an input buffer 100 of FIG. 3. A main bias circuit 101 may generate a variable voltage Vo, a low power supply voltage Vp, and a core voltage Vq and provide them to an input buffer 100. The main bias circuit 101 may generate first to third auxiliary voltages Vo1 to Vo3 and provide them to the input buffer 100.

Levels of the first to third auxiliary voltages Vo1 to Vo3 may vary according to a level of the variable voltage Vo. The auxiliary voltages Vo1 to Vo3 may be provided as controlled bias voltage to each unit of the input buffer 100 such that the stability of internal elements of the input buffer 100 is maintained regardless of the variable voltage Vo having a plurality of levels.

FIG. 4B is a table illustrating levels of auxiliary voltages Vo1 to Vo3 according to a level of a variable voltage Vo. Referring to FIG. 4B, as a variable voltage Vo varies, levels of auxiliary voltages Vo1 to Vo3 may vary. An operation of an input buffer 100 biased by the auxiliary voltages Vo1 to Vo3 will be more fully described with reference to FIG. 5.

Figure 4C:
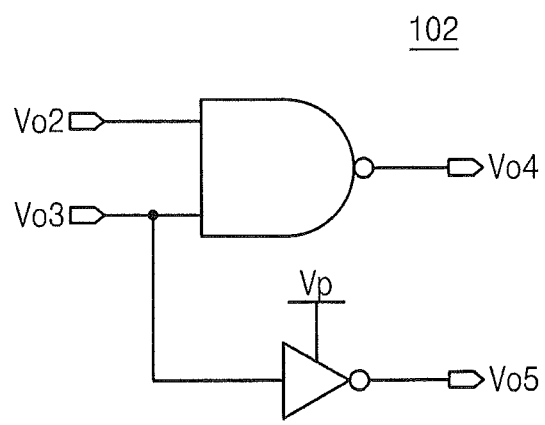
FIG. 4C is circuit diagram schematically illustrating an auxiliary bias circuit providing a driving voltage to the input buffer of FIG. 2.

FIG. 4C is circuit diagram schematically illustrating an auxiliary bias circuit 102 providing a driving voltage to an input buffer 100 of FIG. 2. An auxiliary bias circuit 102 may receive second and third auxiliary voltages Vo2 and Vo3 from a main bias circuit 101 of FIG. 4A. The auxiliary bias circuit 102 may generate a fourth auxiliary voltage Vo4 by NANDing the second and third auxiliary voltages Vo2 and Vo3. The auxiliary bias circuit 102 may generate a fifth auxiliary voltage Vo5 by inverting the third auxiliary voltage Vo3. An operation of an input buffer 100 driven by the auxiliary voltages Vo4 and Vo5 will be more fully described with reference to FIG. 5.

Figure 5:
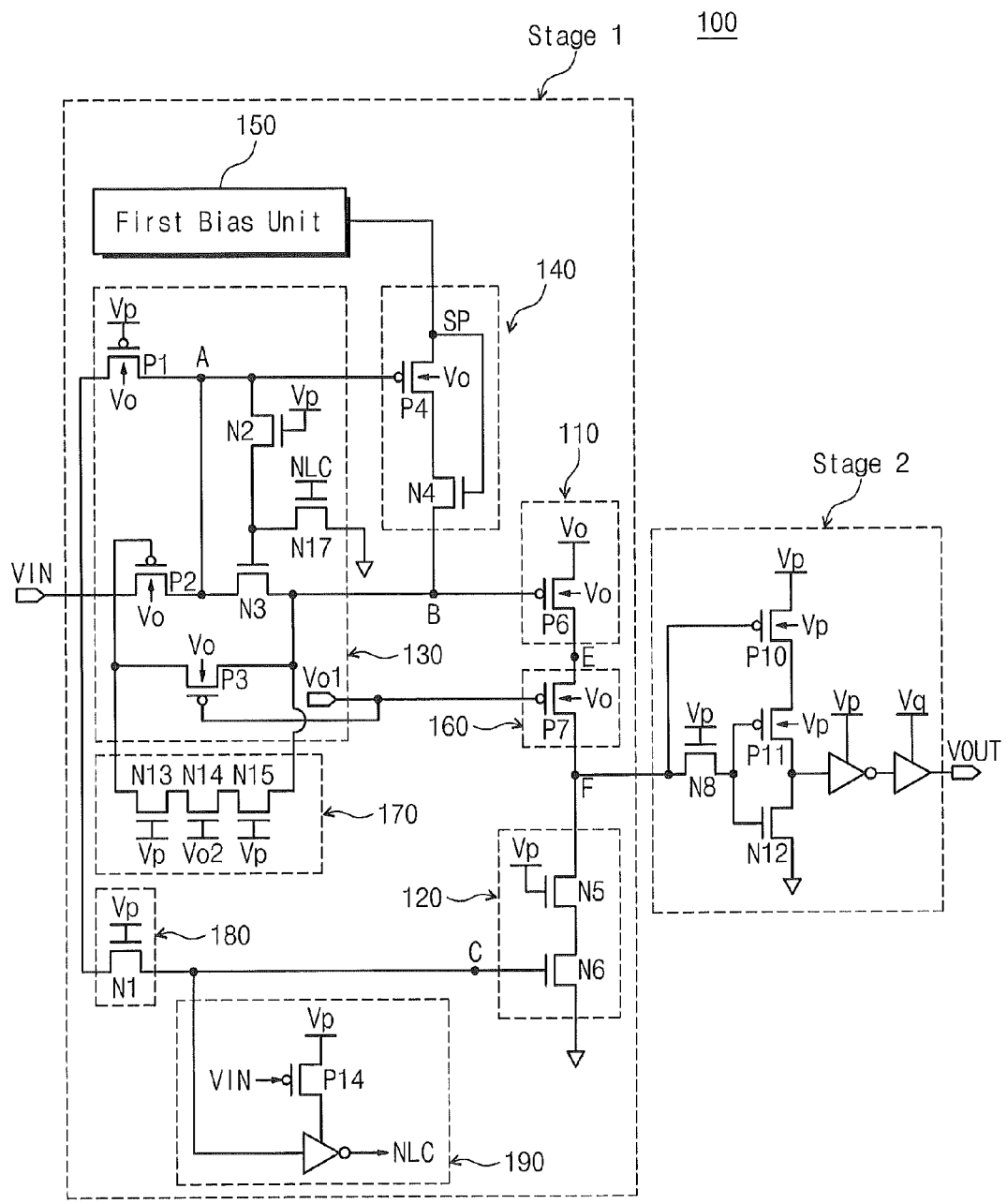
FIG. 5 is a circuit diagram illustrating an input buffer according to FIG. 2.

FIG. 5 is a circuit diagram illustrating an input buffer 100 of FIG. 2. Referring to FIG. 5, an input buffer 100 may include a first stage and a second stage. A high voltage may be applied to each of nodes of PMOS transistors in the first stage according to a state of an input signal. Thus, a variable voltage Vo may be applied as well bias voltages of PMOS transistors in the first stage to prevent a well leakage current.

As described above, the variable voltage Vo may have one of a plurality of voltage levels. In example embodiments, a level of the variable voltage Vo may be decided based on a voltage level when an input signal is at a logic high state. In the case that the input signal is at a high voltage input signal, the variable voltage Vo may be set to a high level (e.g., 3.3V). In the case that the input signal is a low voltage input signal, the variable voltage Vo may be set to a low level (e.g., 1.8V).

Referring to FIG. 5, the first stage of the input buffer 100 may include a pull-up unit 110, a pull-down unit 120, a pull-up control unit 130, a first pull-up protection unit 140, a first bias circuit 150, a second pull-up protection unit 160, a third pull-up protection unit 170, a pull-down control unit 180, and a second bias unit 190.

When a high voltage input signal is applied as an input signal, the input buffer 100 may set the variable voltage Vo to a high level. The input buffer 100 may use the variable voltage set to the high level as an operating voltage of the pull-up unit 110. As the variable voltage is used as an operating voltage of the pull-up unit 110, a toggle voltage Vtg1 of an inverter stage of the input buffer 100, that is, the pull-up unit 110 and the pull-down unit 120 may be set to a Vo/2 level. Thus, the input buffer 100 may satisfy the above-described specification even at an input of the high voltage input signal.

When the variable voltage set to the high level is used as an operating voltage of the pull-up unit 110, a voltage difference between a gate and a source of the pull-up unit 110 at a logic low state of the high voltage input signal may be larger than a limiting voltage of a transistor in the pull-up unit 110. In the input buffer 100, an input signal having a logic low state may not be transferred directly to a gate of the pull-up unit 110 to protect the pull-up unit 110. Instead, in the input buffer 100, a low voltage suitable to turn on the pull-up unit 110 may be applied to the pull-up unit 110 using the first bias circuit 150 and the first pull-up protection unit 140. However, the applied voltage may be a high voltage sufficient for the pull-up unit 110 to resist a voltage difference between a gate and a drain of the pull-up unit 110. Thus, the input buffer 100 may secure the stability and lifetime even at a logic low state of the high voltage input signal.

Below, an operation of a first stage will be more fully described with reference to FIGS. 6 to 8. Referring to FIG. 7, if an input signal is a high voltage input signal, a variable voltage Vo may be set to a high level (e.g., 3.3V) to correspond to the high voltage input signal. If the input signal is at a logic low state, a transistor P2 whose gate is tied with the input signal may be turned on. A transistor P1 may be turned off. As the transistor P2 is turned on, a voltage level of a node A may increase to a voltage level (VIN+Vtp2) higher than that of the input signal VIN. Herein, "Vtp2" may indicate a threshold voltage of the PMOS transistor P2.

A first bias circuit 150 may provide one of predetermined voltage levels according to a level of the variable voltage Vo. For example, the first bias circuit 150 may provide a drain of a transistor P4 with one of a low power supply voltage Vp, a core voltage Vq, and a ground voltage.

Figure 6:
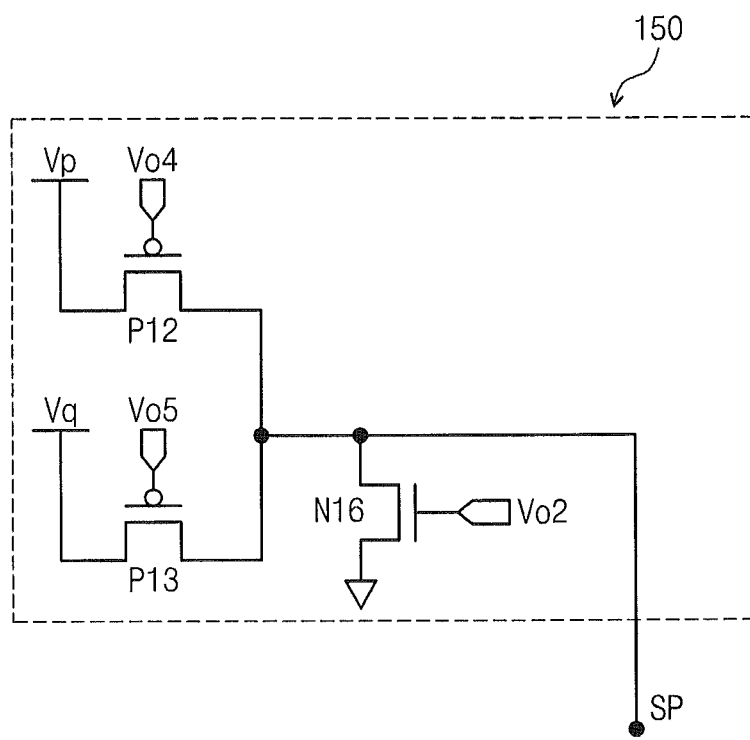
FIG. 6 is a circuit diagram illustrating a first bias circuit of an input buffer according to some embodiments of the inventive subject matter.
Figure 7:
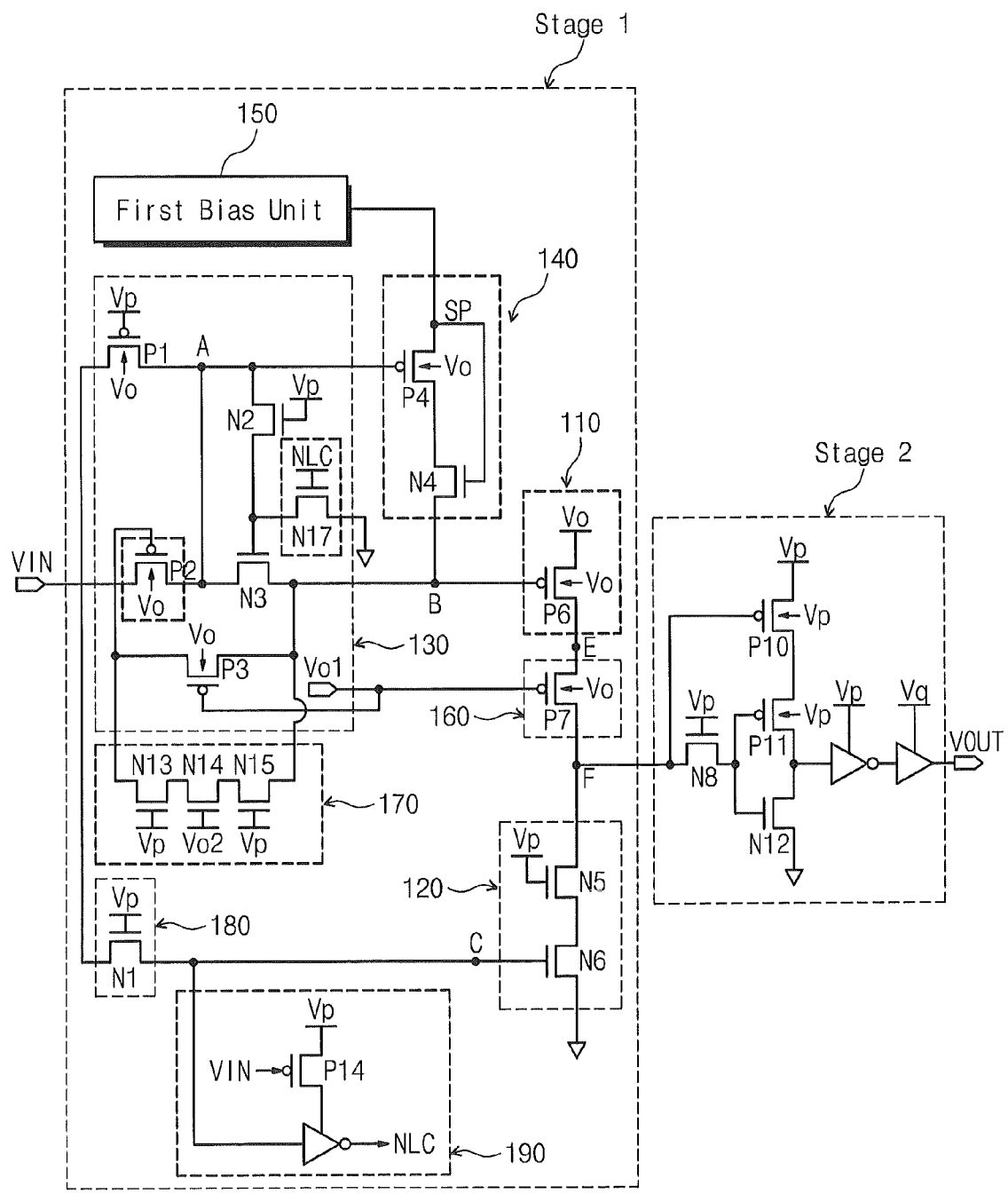
FIG. 7 is a diagram for describing an operation of the input buffer of FIG. 5 when an input signal is at a logic low state.

FIG. 6 is a circuit diagram illustrating a first bias circuit of FIG. 5 according to some embodiments of the inventive subject matter. Referring to FIG. 6, a first bias circuit 150 may include transistors P12, P13, and N16 for selecting voltages. The transistors P12, P13, and N16 may be selectively turned on by auxiliary voltages Vo2, Vo4, and Vo5. Referring to the auxiliary voltages Vo2, Vo4, and Vo5 described with reference to FIGS. 2 and 3, the transistors P12, P13, and N16 may be turned on selectively according to a level of a variable voltage Vo.

For example, if the variable voltage Vo is a high voltage (e.g., 3.3V), the transistor P12 may be turned on. A low power supply voltage Vp may be supplied to a drain of a transistor P4. If the variable voltage Vo is an intermediate voltage (e.g., 2.5V), the transistor P13 may be turned on. A core voltage Vq may be supplied to the drain of the transistor P4. If the variable voltage Vo is a low voltage (e.g., 1.8V), the transistor N16 may be turned on. A ground voltage may be supplied to the drain of the transistor P4.

As described above, the first bias circuit 150 may provide the drain of the transistor P4 with one of the low power supply voltage Vp, the core voltage Vq, and the ground voltage according to a level of the variable voltage Vo. The first bias circuit 150 may not be limited to a circuit in FIG. 6. For example, the first bias circuit 150 may be an external bias circuit that provides a voltage having a level selected in response to a level of the variable voltage Vo.

Returning to FIG. 7, a transistor N4 whose gate is connected with a node SP may limit a voltage of a node B to (VSP-Vtn4). Herein, "VSP" may indicate a voltage of the node SP and "Vtn4" may indicate a threshold voltage of the NMOS transistor N4). The first pull-up protection unit 140 may limit a voltage of the node B to (VSP-Vtn) in response to a control of the pull-up control unit 130 when the input signal is at a logic low state.

In the pull-up unit 110, since a gate of a transistor P6 is connected with the node B, the transistor P6 may be turned on. A voltage of a node E may increase to a level of the variable voltage Vo.

The variable voltage Vo supplied to a drain of the transistor P6 may be a voltage higher than a limiting voltage of the transistor P6. However, as described above, a voltage of the node B may increase to (VSP-Vtn) higher than a ground voltage by the first pull-up protection unit 140.

A voltage of the node B may be a low level sufficient to turn on the transistor P6. However, a voltage of the node B may be a high voltage sufficient for the transistor P6 to resist a voltage difference between a gate and a drain of the transistor P6. Thus, the transistor P6 may secure the stability and lifetime although a high voltage is applied to a drain of the transistor P6.

When a high voltage input signal is received as an input signal, the first pull-up protection unit 140 and the first bias circuit 150 may protect the pull-up unit 110 such that a problem associated with the stability of an element of the pull-up unit 110 is not generated. The first pull-up protection unit 140 and the first bias circuit 150 may protect the pull-up unit 110 by providing the pull-up unit 110 with a voltage increased to (VSP-Vtn), not a low level signal.

In the second pull-up protection unit 160, if a transistor P6 is turned on, the first auxiliary voltage Vo1 may be applied to a gate of a transistor P7. At this time, the transistor P7 may be turned on. The first auxiliary voltage Vo1 may be a low voltage sufficient to turn on the transistor P7.

However, first auxiliary voltage Vo1 may be a high voltage sufficient for the transistor P7 to resist a voltage difference between a gate and a drain of the transistor P7. Thus, the transistor P7 may secure the stability and lifetime although a high voltage, that is, the variable voltage Vo is applied to a drain of the transistor P7. As the transistor P7 is turned on, a voltage of a node F may increase to a level of the variable voltage Vo. A role of the second pull-up protection unit 160 will be more fully described with reference to FIG. 7.

Although a voltage of the node F increases to a level of the variable voltage Vo, a transistor N5 of the pull-down unit 120 may be turned on to block a high voltage. Thus, the stability of the transistor P6 may be maintained.

A transistor P3 may be turned off such that the nodes A and B are not connected. However, since the node A has a voltage a little higher than a ground level by the transistor P2, a transistor N3 may be slightly turned on. If the transistor N3 is turned on, a leakage current may flow from the node B to the node A and an input pad.

The pull-up control unit 130 may include a transistor N17 to prevent a turn-on operation of a transistor N3. A gate of the transistor N17 may be supplied with a discharge signal NLC from a second bias circuit 190. The discharge signal NLC may have a low power supply voltage Vp at a logic low state of the input signal VIN and a ground voltage at a logic high state of the input signal VIN.

When the input signal VIN is at a logic low state, the transistor N17 may be turned on by the discharge signal NLC. The transistor N17 turned on may pull a gate of the transistor N3 down such that the transistor N3 is fully turned on. Since the transistor N17 is turned off at a logic low state of the input signal VIN, a leakage current may be blocked at logic low and high states of the input signal VIN.

As described above, in the case that the input signal VIN is a high voltage input signal, the first stage of the illustrated embodiments of the inventive subject matter may provide an output terminal, that is, the node F with an output voltage having a logic high state at a logic low state of the input signal VIN without stability and reliability problems. The first stage may also include a discharge circuit to block a leakage current.

If the input signal VIN is a low voltage input signal, the variable voltage Vo may be set to a low voltage (e.g., 1.8V) to correspond to the low voltage input signal. When the input signal VIN is a low voltage input signal, a transistor N14 of the third pull-up protection unit 170 may be turned on. Transistors N13 to N15 in the third pull-up protection unit 170 may be turned on, so that the input signal VIN is transferred to the node B.

Since an operating voltage of the pull-up unit 110 is the variable voltage Vo having a low level, the pull-up unit 110 may provide the node F with an output voltage having a logic high level without stability and reliability problems. Since the transistor N14 is turned off when the input signal VIN is a high voltage input signal or an intermediate input signal, there may be intercepted the third pull-up protection unit 170 which enables the input signal VIN to be applied directly to the pull-up unit 110 when the input signal VIN is not a low voltage input signal.

As described above, in the case that the input signal VIN is a low voltage input signal, the first stage of the inventive subject matter may provide an output terminal, that is, the node F with an output voltage having a logic high state at a logic low state of the input signal VIN without stability and reliability problems.

Figure 8:
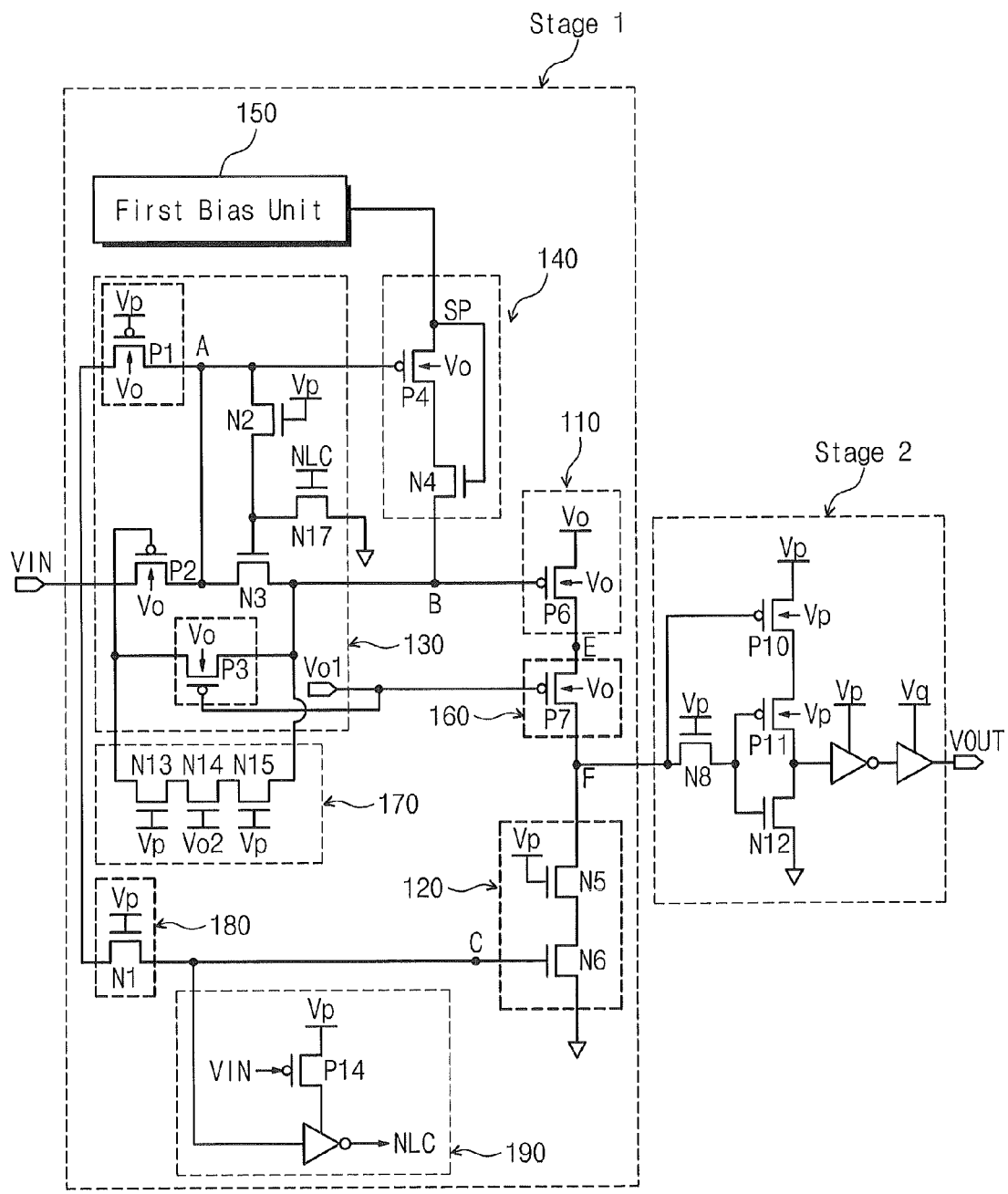
FIG. 8 is a diagram for describing an operation of an input buffer of FIG. 5 when an input signal is at a logic high state.

FIG. 8 is a diagram for describing an operation of an input buffer 100 when an input signal is at a logic high state. If an input signal VIN is switched into a logic high state from a logic low state, a transistor N1 of a pull-down control unit 180 may be turned on. The transistor N1 may prevent the input signal VIN having a high level from being transferred directly to a pull-down unit 120. As the transistor N1 is turned on, a voltage of a node C may increase to (Vp−Vtn1). Herein, "Vp" may indicate a low power supply voltage and "Vtn1" may indicate a threshold voltage of the transistor N1.

If a voltage of the node C increases, a transistor N6 of the pull-down unit 120 may be turned on. When the transistor N6 is turned on, a transistor N5 whose gate is supplied with the low power supply voltage Vp may be turned on. As the transistor N5 and N6 are turned on, a voltage of the node F may decrease to a ground voltage level.

If the input signal VIN is switched into a logic high state from a logic low state, a transistor P1 may be turned on. As the transistor P1 is turned on, a voltage of a node A may increase to a level of the input signal VIN. As a voltage of the node A increases, a transistor P4 whose gate is connected with the node A may be turned off. Thus, a bias voltage generated from a first bias circuit 150 may not be supplied to a node B.

As a voltage of the node A increases, a transistor N2 may be turned on to prevent a high voltage level of the input signal VIN from being applied to a gate of a transistor N3. A voltage of (Vp−Vtn2) may be applied to a gate of the transistor N3 through the transistor N2. Herein, "Vtn2" may indicate a threshold voltage of the transistor N2.

If the input signal VIN is at a logic high state, a transistor P3 whose gate is connected with a first auxiliary voltage Vo1 may be turned on. As the transistor P3 is turned on, a voltage of the node B may increase to a level of the input signal VIN. If a voltage of the node B increases, a transistor P6 of a pull-up unit 110 may be turned off. The variable voltage Vo having a high level may be applied to a drain of the transistor P6. Thus, although a high voltage level of the input signal VIN is applied to a gate of the transistor P6, it is possible to secure the stability and lifetime of the transistor P6.

A transistor P7 of a second pull-up protection unit 160 may be turned on to protect the pull-up unit 110. As the transistor P7 is turned on, a voltage of a node E may increase to (Vo1+ Vtp7) higher than a ground voltage. Herein, "Vo1" may indicate a first bias voltage and "Vtn7" may indicate a threshold voltage of the transistor P7. A voltage higher than a ground voltage is applied to the node E. Thus, although a high voltage level of the input signal VIN is applied to a gate of the transistor P6, it is possible to secure the stability and lifetime of the transistor P6.

As described above, in the case that the input signal VIN is a high voltage input signal, a first stage according to some embodiments of the inventive subject matter may provide an output terminal, that is, the node F with an output voltage having a logic low state at a logic high state of the input signal VIN without stability and reliability problems.

As described above, referring to FIGS. 6 to 8, the first stage of the input buffer 100 may provide an output terminal, that is, a node F with an output voltage regardless of a level of an input signal and without stability and reliability problems.

A second stage of the input buffer 100 may be provided with a voltage of an output terminal of the first stage, that is, a voltage of the node F as an input signal. As described with reference to FIG. 1, the second stage may operate with a low power supply voltage Vp. As described in FIG. 1, the second stage may stably operate although an input signal having a high level is received. The reason may be that a low voltage is provided through a transistor N8. Below, operation of first and second stages will be described with reference to FIG. 9.

Figure 9:
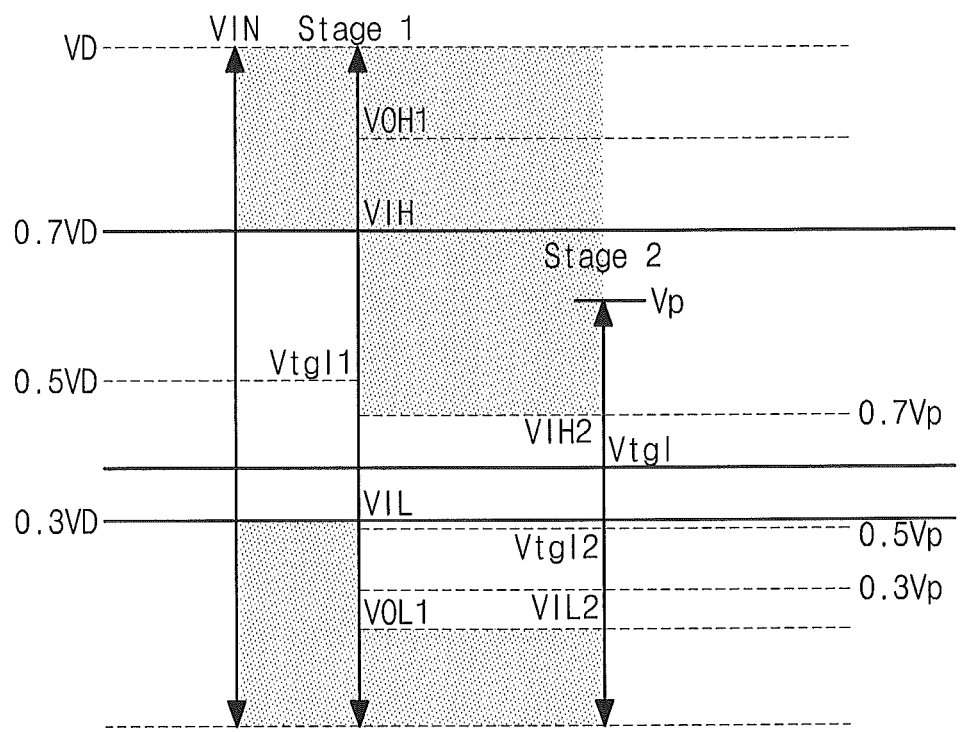
FIG. 9 is a diagram illustrating an input/output voltage range of an input signal, a first stage and a second stage when an input signal is a high voltage input signal.

FIG. 9 is a diagram illustrating an input/output voltage range of an input signal, a first stage and a second stage when an input signal is a high voltage input signal.

Referring to FIG. 9, an input signal VIN may have a high voltage VD (e.g., 3.3V) at a logic high state. A first stage may operate with a variable voltage having a high level (e.g., VD) when a high voltage input signal is received.

For the reliability of circuit, VIH and VIL of an input buffer 100 may satisfy 0.7VD and 0.3VD, respectively. In example embodiments, since an operating voltage of the first stage has a high level, a toggle voltage Vtg1 of the first stage may be between the VIH and the VIL.

If a signal having a logic low state is provided to an input pad, the first stage may output a signal having a logic high state. An output signal of the first stage having a logic high state may have a value higher than a minimum logic high output voltage (hereinafter, referred to as "VOH1"). When a signal having a logic high state is provided to the input pad, the first stage may output a signal having a logic low state. An output signal of the first stage having a logic low state may have a value lower than a maximum logic low output voltage (hereinafter, referred to as "VOL1").

A second stage may operate with a low power supply voltage Vp. A toggle voltage Vtg1 of the second stage may have a 0.5Vp level.

When the first stage outputs a signal having a logic high state, the second stage may provide a pull-down unit N12 (refer to FIGS. 5 to 7) with a voltage lower than the low power supply voltage Vp using a transistor N8 (refer to FIGS. 5 to 7). Thus, although an input signal having a high level is received, the second stage may operate stably.

As described above, when the first stage outputs a signal having a logic low state, an output signal of the first stage having a logic low state may have a value lower than the VOL1. As illustrated, since the VOL1 is lower than a toggle voltage Vtg12 of the second stage, the second stage may reliably operate although a signal having a logic low state is received from the first stage.

The toggle voltage Vtg1 of an input buffer 100 may be between 0.5VD and 0.5Vp. Thus, the toggle voltage Vtg1 of the input buffer 100 may be between the VIH and the VIL of the input buffer 100.

Although a high voltage input signal is received, the above-described low-voltage element input buffer 100 may operate without stability and reliability problems using the first and second stages.

Figure 10:
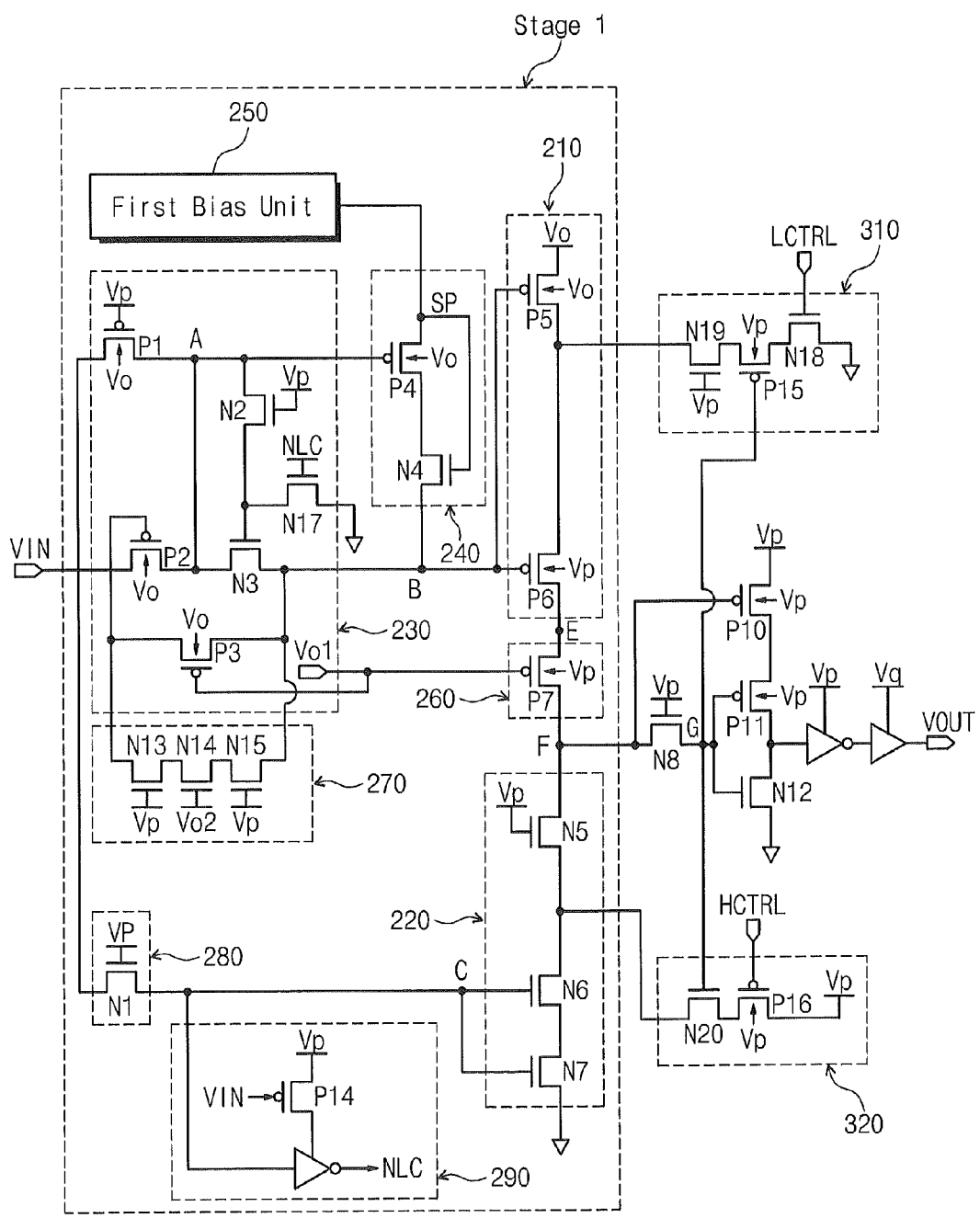
FIG. 10 is a circuit diagram illustrating an input buffer according to further embodiments of the inventive subject matter.

FIG. 10 is a circuit diagram illustrating an input buffer 200 according to further embodiments of the inventive subject matter. Referring to FIG. 10, an input buffer 200 may include a pull-up unit 210, a pull-down unit 220, a pull-up control unit 230, a first pull-up protection unit 240, a first bias circuit 250, a second pull-up protection unit 260, a third pull-up protection unit 270, a pull-down control unit 280, a second bias circuit 290, a low threshold voltage modulating unit 310, and a high threshold voltage modulating unit 320. In FIG. 10, the constituent elements 230 to 290 of the input buffer 200 may be substantially the same as constituent elements 130 to 190 of an input buffer 100 in FIG. 1.

The input buffer 200 may operate like a Schmitt trigger circuit using the low threshold voltage modulating unit 310 and the high threshold voltage modulating unit 320. The input buffer 200 may increase a noise margin by modulating a low threshold voltage Vsp1 and a high threshold voltage Vsph.

In example embodiments, the low threshold voltage Vsp1 and the high threshold voltage Vsph may be threshold voltages of a first stage. When an output terminal of the first stage, that is, a node F is at a logic low state, the node F may maintain a voltage corresponding to a logic low state until a voltage level of an input signal VIN reaches the high threshold voltage Vsph. A state of the node F may be switched into a logic high state when the input signal VIN has a voltage higher than the high threshold voltage Vsph.

When the output terminal of the first stage, that is, the node F is at a logic high state, the node F may maintain a voltage corresponding to a logic high state until a voltage level of the input signal VIN reaches the low threshold voltage Vsp1. A state of the node F may be switched into a logic low state when the input signal VIN has a voltage lower than the low threshold voltage Vsp1.

The low threshold voltage modulating unit 310 may modulate the low threshold voltage Vsp1 of the input buffer 200. The low threshold voltage modulating unit 310 may operate responsive to a lower control signal LCTRL. The lower control signal LCTRL may be activated according to a logic high state of the input signal VIN.

As described with reference to FIG. 9, the toggle voltage Vtg1 of the input buffer 200 may satisfy the following equation 2.

$$0.5 Vp \leq Vtg1 \leq 0.5 Vo \qquad (2)$$

As understood from the equation 2, the toggle voltage Vtg1 of the input buffer 200 may vary according to a level of a variable voltage Vo being an operating voltage of a first stage. Thus, in the case that the input signal VIN is a high voltage input signal, the input buffer 200 may have a sufficient noise margin without modulating of the low threshold voltage Vsp1. The reason may be that the variable voltage Vo is set to a high level.

In the case that the input signal VIN is a low voltage input signal, the toggle voltage Vtg1 of the input buffer 200 may be set to a 0.5Vp level. Since the input buffer 200 has a small noise margin, it is desirable to lower the low threshold voltage Vsp1 to improve a noise characteristic of the input buffer 200.

The low threshold voltage modulating unit 310 may be a feedback circuit connected with a pull-up unit 210. The lower control signal LCTRL may be activated when the input signal VIN is a low voltage signal. To lower the low threshold voltage Vsp1 of the input buffer 200, the low threshold voltage modulating unit 310 may be selectively activated when the input signal VIN is a low voltage input signal. This will be more fully described with reference to accompanying drawings.

If the lower control signal LCTRL is activated, a transistor N18 may be turned on. Since a source of the transistor N18 is connected with a ground voltage, the transistor N18 may pull a transistor P15 down.

As described with reference to FIGS. 5 to 8, when the input signal VIN is at a logic high state, nodes F and G may go to a logic low state. If the node G is at a logic low state, a transistor P15 may be turned on. When the input signal VIN is switched into a logic low state from a logic high state, a voltage of a node H may be maintained at a low state by a feedback of the low threshold voltage modulating unit 310. Thus, the low threshold voltage Vsp1 of the input buffer 200 may be lowered.

A transistor N19 may protect the low threshold voltage modulating unit 310 when the input signal VIN is a high voltage input signal. Although the node H has a high voltage (e.g., 3.3V), a voltage of (Vp−Vtn19) may be transferred to a source of the transistor P15 by the transistor N19. Herein, "Vtn19" may indicate a threshold voltage of the transistor N19.

The high threshold voltage modulating unit 320 may modulate the high threshold voltage Vsph of the input buffer 200. The high threshold voltage modulating unit 320 may be a feedback circuit connected with a pull-down unit 220. This will be more fully described with reference to accompanying drawings.

When the input signal VIN is at a logic low state, the nodes F and G may go to a logic high state. If the node G is at a logic high state, a transistor N20 may be turned on.

A transistor P16 may be turned on in response to a higher control signal HCTRL. The higher control signal HCTRL may be decided according to a logic high state level of the input signal VIN.

Since a source of the transistor P16 is connected with a low power supply voltage Vp, the transistor P16 may pull a transistor N20 up. When the input signal VIN is switched into a logic high state from a logic low state, a voltage of a node I may be maintained at a high state by a feedback of the high threshold voltage modulating unit 320. Thus, the high threshold voltage Vsph of the input buffer 200 may be lowered.

The above-described input buffer 200 may satisfy a Vtg1 condition using a variable voltage Vo even when an input signal is a high voltage input signal. The input buffer 200 may increase a noise margin by modulating low and high threshold voltages.

Embodiments of the inventive subject matter may be modified or changed variously. For example, a first stage and a second stage may be changed or modified variously according to environment and use. While the inventive subject matter has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An input buffer comprising:
   a first stage which is formed of semiconductor circuit elements for a first power supply voltage, receives a variable voltage same or higher than the first power supply voltage as an operating voltage, and generates a first output signal in response to an input signal; and
   a second stage which is formed of a semiconductor circuit element for the first power supply voltage, receives the first power supply voltage as an operating voltage, and generates a second output signal as an input buffering output in response to the first output signal,
   wherein the variable voltage has one selected from a plurality of levels according to a level of a first state voltage of the input signal,
   wherein the first stage comprises:
   a pull-up unit which generates a pull-up output signal in response to a pull-up input signal;
   a pull-down unit which generates a pull-down output signal in response to the input signal;
   an output unit which generates a first output signal in response to the pull-up and pull-down output signals; and
   a first pull-up protection unit which provides the pull-up input signal to the pull-up unit in response to the input signal,
   wherein when the input signal is at a logic low state, the first pull-up protection unit provides the pull-up unit with a pull-up bias voltage, as the pull-up input signal, varied in response to a level of the variable voltage.

2. The input buffer of claim 1, wherein the pull-up unit generates the variable voltage as the pull-up output signal when the pull-up bias voltage is provided as the pull-up input signal.

3. The input buffer of claim 1, wherein the first stage further comprises:
   a first bias circuit which generates the pull-up bias voltage; and
   wherein the first bias circuit comprises:
   a first switch which provides the first power supply voltage as the pull-up bias voltage in response to a first control signal; and
   a second switch which provides a ground voltage as the pull-up bias voltage in response to a second control signal,
   the first and second control signals being selectively activated according to a level of the variable voltage.

4. The input buffer of claim 1, wherein if a logic high state voltage of the input signal is the first power supply voltage, the first pull-up protection unit provides the pull-up unit the input signal as a pull-up input signal instead of the pull-up bias voltage when the input signal is at a logic low state.

5. The input buffer of claim 4, further comprising:
   a second pull-up protection unit which is connected with an output terminal of the pull-up unit, and
   wherein the pull-down unit generates a ground voltage as a pull-down output signal when the input signal is at a logic high state, and the second pull-up protection unit is turned on when the first output signal has a ground voltage, such that a voltage of the output terminal of the pull-up unit increases.

6. The input buffer of claim 4, further comprising:
   a pull-down protection unit which is connected with an input terminal of the pull-down unit, and
   wherein the pull-down protection unit limits a level of the input signal to a predetermined level when the input signal is at a logic high state.

7. The input buffer of claim 4, wherein the second stage comprises:
   a low threshold voltage modulating unit which is connected with the pull-up unit and modulates a low threshold voltage of the input buffers; and
   a high threshold voltage modulating unit which is connected with the pull-down unit and modulates a high threshold voltage of the input buffers,
   the low threshold voltage modulating unit being activated when a logic high state level of the input signal is a level of the first power supply voltage.

8. An input buffer comprising:
   an pull-up unit which is formed of a semiconductor circuit element for a first power supply voltage, receives a variable voltage same or higher than the first power supply voltage as an operating voltage, and generates a pull-up output signal in response to a pull-up input signal;
   a pull-down unit which is formed of a semiconductor circuit element for the first power supply voltage and generates a pull-down output signal in response to an input signal;
   an output unit which generates a first output signal in response to the pull-up and pull-down output signals;
   a pull-up control unit which generates the pull-up control signal in response to the input signal; and
   a pull-up protection unit which provides a pull-up input signal to the pull-up unit in response to the pull-up control signal,
   wherein the pull-up protection unit comprises a first pull-up protection transistor having a source connected to receive a pull-up bias voltage, a gate connected to receive a pull-up control signal, and a drain connected to output the pull-up bias voltage; and a second pull-up protection transistor having a drain connected with the drain of the first pull-up protection transistor, a gate connected to receive the pull-up bias voltage, and a source connected to output the pull-up input signal;
   wherein the pull-up unit comprises a pull-up transistor having a source connected to receive a variable voltage, a gate connected to receive the pull-up input signal, and a drain connected to output the pull-up output signal; and
   wherein the variable voltage has one selected from a plurality of levels according to a level of a first state voltage of the input signal.

9. The input buffer of claim 8, wherein the pull-up control unit comprises:

a first discharge transistor having a source connected to receive a ground voltage, a gate connected to receive a discharge signal, and a drain; and a second discharge transistor having a drain connected with the gate of the first pull-up protection unit, a source connected with the drain of the first discharge transistor, and a gate connected to receive the first power supply voltage, the discharge signal being an inverted version of the input signal.

10. The input buffer of claim 9, wherein the pull-up control unit further comprises:

a third pull-up protection transistor having a gate connected with the drain of the first discharge transistor, a drain connected with the drain of the second discharge transistor, and a source connected with the gate of the pull-up transistor.

11. The input buffer of claim 8, wherein the pull-up control unit comprises NMOS transistors connected in series, one end of the NMOS transistors is connected to receive the input signal, the other end of the NMOS transistors is connected with the gate of the pull-up transistor, and gates of the NMOS transistors are controlled such that the NMOS transistor are all turned on when a logic high state voltage of the input signal is the first power supply voltage and the input signal is at a logic low state.

12. The input buffer of claim 8, wherein the pull-down unit comprises:

a pull-down control transistor having a drain connected to receive the input signal, a gate connected to receive the first power supply voltage, and a source connected to output the pull-down control signal; and a pull-down transistor having a source connected to receive a ground voltage, a gate connected to receive the pull-down control signal, and a drain connected to output the pull-down output signal.

13. The input buffer of claim 12, wherein the pull-down unit further comprises:

a pull-down protection transistor having a source connected with the drain of the pull-down transistor, a gate connected to receive the first power supply voltage, and a drain connected to output the pull-down output signal.

14. An input buffer comprising:

a first stage configured to generate a first output signal at an output thereof in response to an input signal, the first stage comprising semiconductor circuit components configured to be adapted to a first power supply voltage and configured to be variably biased responsive to a variable voltage, the first stage comprising:

a pull-up control circuit configured to generate a pull-up input signal responsive to the input signal;

a pull-up circuit having an input that receives the pull-up input signal and that is configured to selectively couple the output of the first stage to a node having the variable voltage responsive to the pull-up input signal;

a bias circuit configured to generate a bias voltage responsive to the variable voltage; and a pull-up protection circuit coupled to the input of the pull-up circuit and configured to control a level of the pull-up input signal responsive to the bias voltage;

a second stage configured to receive the first output signal and to responsively generate a second output signal, the second stage biased according to the first power supply voltage; and the bias circuit configured to generate the variable voltage responsive to a state of the input signal, wherein the variable voltage is same or higher than the first power supply voltage.

15. The input buffer of claim 14, wherein the semiconductor circuit components comprise field-effect transistors having wells configured to be variably biased responsive to the variable voltage.

16. The input buffer of claim 14, wherein the bias circuit is configured to generate the variable voltage in proportion to a voltage of a logic high state of the input signal.

17. The input buffer of claim 14, wherein first stage comprises:

a pull-up circuit coupled to an output node of the first stage and configured to pull up the output node to the variable voltage; and a pull-up control circuit configured to limit a voltage applied to an input of the pull-up circuit responsive to the variable voltage.

18. The input buffer of claim 14, wherein the second stage is configured to receive input signals having a first maximum voltage and wherein the first stage is configured to receive input signals having a second maximum voltage greater than the first maximum voltage.

19. The input buffer of claim 14, wherein the pull-up protection circuit is configured to selectively couple and decouple the input of the pull-up circuit and the bias circuit responsive to the input signal.

20. The input buffer of claim 14, wherein the pull-up protection circuit is configured to limit a gate-to-drain voltage of a transistor of the pull-up circuit responsive to a logic state of the input signal.

* * * * *